United States Patent [19]

Flint et al.

[11] Patent Number: 4,759,403
[45] Date of Patent: Jul. 26, 1988

[54] HYDRAULIC MANIFOLD FOR WATER COOLING OF MULTI-CHIP ELECTRIC MODULES

[75] Inventors: Ephraim B. Flint, Garrison; Kurt R. Grebe, Beacon, both of N.Y.

[73] Assignee: International Business Machines Corp., Armonk, N.Y.

[21] Appl. No.: 858,135

[22] Filed: Apr. 30, 1986

[51] Int. Cl.$^4$ .............................................. H05K 7/20
[52] U.S. Cl. .................................... 165/80.4; 361/385
[58] Field of Search ............... 165/80.4, 142; 361/385; 357/82

[56] References Cited

U.S. PATENT DOCUMENTS

| | | | |
|---|---|---|---|
| 3,361,195 | 1/1968 | Mayerhoff et al. | 165/80 |
| 3,364,039 | 1/1968 | Tambussi | 106/38.3 |
| 3,989,099 | 11/1976 | Hosono et al. | 165/80.4 |
| 4,020,399 | 4/1977 | Suzuki et al. | 165/80.4 X |
| 4,138,692 | 2/1979 | Meeker et al. | 357/82 |
| 4,156,458 | 5/1979 | Chu et al. | 165/81 |
| 4,209,129 | 6/1980 | Haas et al. | 165/142 X |
| 4,226,281 | 10/1980 | Chu | 165/80 |
| 4,558,395 | 12/1985 | Yamada et al. | 361/385 |
| 4,561,040 | 12/1985 | Eastman et al. | 165/80.4 |

OTHER PUBLICATIONS

IBM Technical Disclosure Bulletin, "Integrated Circuit Module Package Cooling Structure", A. L. Pascuzzo et al., vol. 20, No. 10, Mar. 1978, pp. 3898-3899.

Primary Examiner—Ira S. Lazarus
Assistant Examiner—Peggy A. Neils
Attorney, Agent, or Firm—Perman & Green

[57] ABSTRACT

A manifold for conducting coolant to a set of heat exchangers mounted on individual electric circuit chips of a circuit module is formed of a solid body containing fluid passages terminating in apertures, the manifold being provided with a set of hollow flexible appendages connected to the apertures for conducting coolant to ports of the heat exchangers. The body is formed of two sections, one section having channels machined therein to serve as the fluid passages, and a second section having the apertures. The second section also is bounded by sidewalls which define a cavity. The appendages are formed by a lost wax molding operation wherein the wax is stored in the cavity, and milled to form a mold for the appendages. A plastic material is deposited on the wax mold and on the second section of the body to form the set of appendages, the plastic material being of a type which can be deposited by the process of chemical vapor deposition, thereby to provide a conformal deposition which imparts a water-tight characteristic to the manifold.

8 Claims, 5 Drawing Sheets

HYDRAULIC MANIFOLD FOR WATER COOLING OF MULTI-CHIP ELECTRIC MODULES

BACKGROUND OF THE INVENTION

This invention relates to cooling systems for electric circuit chips and, more particularly, to a manifold having flexible connectors for mating with a plurality of individual chip heat exchangers for the cooling of electric circuits.

Electric circuits are fabricated frequently in the form of chips. Complex electronic systems are constructed of many such chips which are disposed on a common substrate, such an arrangement of the chips being referred to as a module. A module may have as many as one hundred or more chips. A set of the modules may be electrically interconnected to provide still larger systems.

A particular concern in the construction of the modular electronic systems is the production of heat by the electric circuits. Because of the many circuits, the heat is considerable. The heat must be removed to prevent excessive heating and destruction of the circuits.

High power chips can now be cooled by use of forced-convection silicon heat exchangers which are thermally attached to respective ones of the chips, as is described in the following articles: (1) D. B. Tuckerman and R. F. W. Pease, "High Performance Heat Sinking for VLSI", IEEE Electron Device Letters EDL-2, Page 126 (1981); and (2) A. Zingher and P. Gruber, "Chip Cooling for Very High Power Density Electronic Packaging", ITL Conference, Boca Raton, Fla. (1983). A source of cooled liquid such as water is connected between input and output ports of the heat exchangers to pass the water through the heat exchangers for removal of heat from the circuit chips. An array of the heat exchangers connected to respective ones of the chips is an effective means for maintaining proper operating temperature for an entire module of electric circuits. All of the heat exchangers are to be connected to the source of cooling liquid for removal of heat from the module.

A problem arises in the connection of a source of cooling water to many heat exchangers mounted on the chips of a circuit module because of the dense packaging of the chips. The chips and the heat exchangers mounted thereon may be positioned in two dimensions with a pitch of less than a centimeter, and each heat exchanger has two ports (input and output) which are to be connected to the water source. A particular aspect of the problem is manifested in the maintenance of tolerances among positions of the ports to allow for an interfacing with a suitable connection device.

A further aspect of the problem is the necessity for stress relief because of the specific materials employed in the construction of the electric circuits. For example, the substrate upon which the chips are mounted may be fabricated of ceramic, and semiconductor circuitry within the chips may be fabricated of silicon. Both the ceramic and the silicon are rigid materials which might introduce excessive stress to soft metallic ball contacts located between the chips and the substrate for making electrical connection between circuits of the chips and electrical conductors located in the substrate. Therefore, there is a need for mechanically decoupling the source of cooling water from the heat exchangers to prevent a buildup of any additional stresses which might be introduced by the water source.

SUMMARY OF THE INVENTION

The foregoing problem is overcome and other advantages are provided by a manifold which interconnects a source of cooling fluid, particularly water, to the multiplicity of heat-exchanger ports in a circuit module constructed of many chips. In accordance with the invention, the manifold is constructed with a rigid body having fluid conduits therein, and includes a set of flexible hollow appendages communicating with the fluid conduits and extending from the body to make contact with individual ones of the heat-exchanger ports. The rigid body may have a linear shape to make contact with a line of water inlets or a line of water outlets in a row of heat exchangers. In this case, the body would be constructed of two parts arranged in pairs, with one body part and its associated appendages servicing the inlet ports and a second body part and its associated appendages servicing the outlet ports of the row of heat exchangers.

Alternatively, a manifold may be formed to service a rectangular array of heat exchangers, in which case the manifold comprises a rigid body of rectangular shape with a rectangular array of flexible hollow appendages depending therefrom to contact ports from a rectangular array of heat exchangers. A feature in this embodiment of the invention is the combination of a single inlet appendage and a single outlet appendage into a composite coaxial appendage. The construction of the heat exchangers is modified to provide for coaxial inlets and outlets.

An important aspect of the invention is the mode of manufacture of the manifold to insure water-tight integrity. The solid body portion of a linear manifold is formed of two sections which are held together to contain the water. One of the sections contains fluid conduction channels machined therein. The other section has apertures in which are mounted the hollow appendages. The solid body portion of a rectangular manifold comprises three sections, namely, a first section with the fluid conduction channels, a second section having apertures for holding the inner of the coaxial appendages, and a third section secured to the second section and having apertures for holding the outer of the coaxial appendages.

A feature in the manufacture of the manifold is the construction of the hollow flexible appendages in the form of bellows of thin plastic material whereby the mouths of the bellows are movable readily in three orthogonal directions corresponding to the x, y, and z directions of the axes of an xyz coordinate system. This permits the mouths of the bellows to be positioned independently for mating with the ports of the heat exchangers. The flexibility of the bellows construction also serves to isolate mechanically the heat exchanger and chip from a source of liquid coolant, and thereby provide stress relief to the ball contacts between the chips and a substrate supporting the chips. The plastic bellow material is substantially impervious to water and other cooling fluids which may be employed. The water-tight integrity of the manifold is attained by forming the appendages integrally with a section of the solid body by a casting technique which prevents the development of any voids through which liquid might leak and contaminate electrical components of the module.

The casting of the appendages is accomplished by a lost wax technique wherein an apertured section of the solid body is filled with wax, the bellows forms of the appendages are machined in the wax, and then the plastic material is deposited in vacuum by chemical vapor deposition (CVD) upon the wax and the apertured section of the solid body. Excess plastic material, such as webbing between mouths of the bellows, may be trimmed away. Then the wax is melted and poured off to leave a completed assembly of appendages secured to an apertured section of the solid body. In the casting operation, it is advantageous to mount the body section on the cold finger of a cooling device to chill the body section and the wax therein, thereby to enhance nucleation of the deposited particles of the plastic material. The use of the CVD process in the formation of the appendages insures a conformal adhesion of the appendages to the solid body for water-tight operation of the manifold of the invention.

BRIEF DESCRIPTION OF THE DRAWING

The foregoing aspects and other features of the invention are explained in the following description, taken in connection with the accompanying drawing wherein.

DETAILED DESCRIPTION

With reference to FIGS. 1-4, an electronic circuit module 20 comprises an array of circuit chips 22 supported upon a common substrate 24 and interconnected electrically by well known conductors (not shown). By way of example, the array of chips is a rectangular array having rows and columns of the chips 22, it being understood that the invention applies also to other forms of arrays. A set of silicon heat exchangers 26 is provided for cooling the chips 22, one heat exchanger 26 being mounted by conventional means on each chip 22 for removal of heat therefrom. The heat exchangers 26 are operative with liquid coolant provided by a chiller 28.

Figure 1:
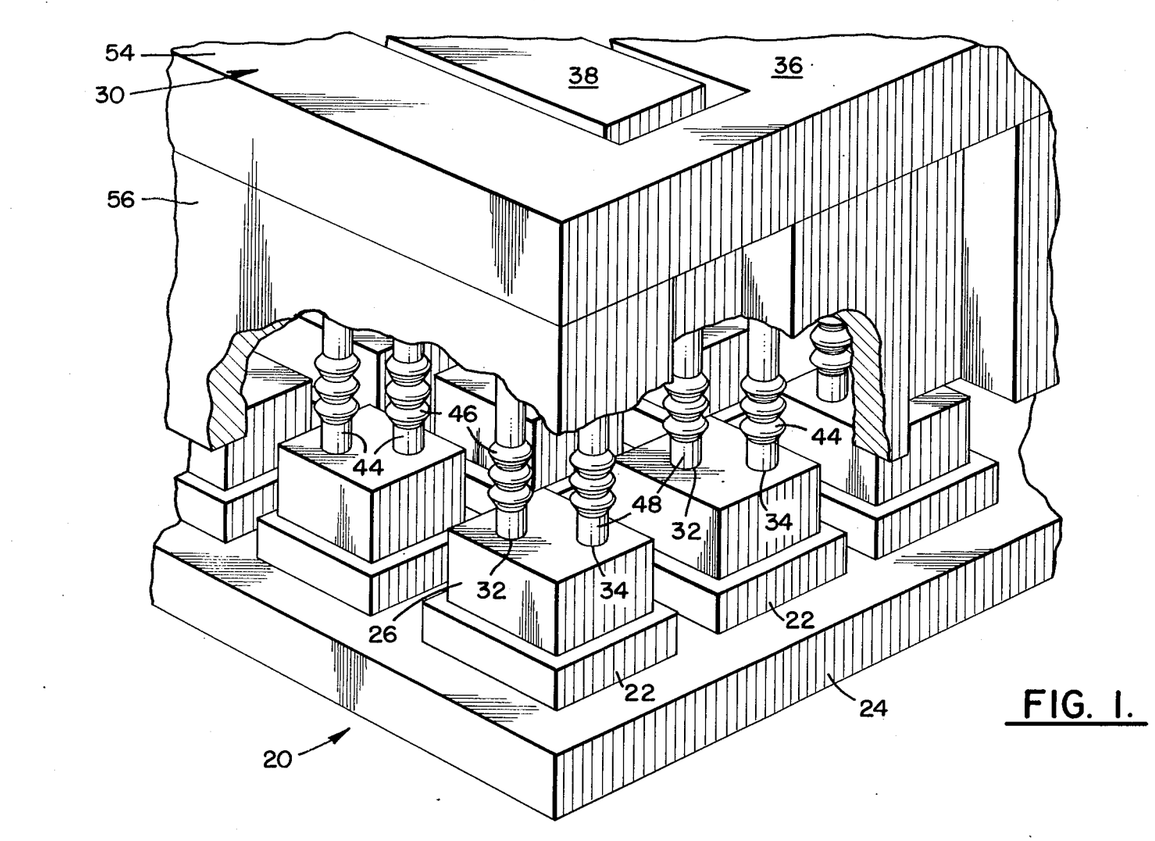
FIG. 1 is a perspective view, partially diagrammatic, of one embodiment of a module having a set of electric circuit chips having individual heat exchangers connecting with a manifold for receipt of liquid coolant in accordance with the invention, a part of the module being cut away to show the chips.

In accordance with the invention, the coolant is carried from the chiller 28 and distributed among the heat exchangers 26 by a manifold 30. In this embodiment of the invention, each heat exchanger 26 is understood to be provided with separate, spaced-apart coolant parts, namely, a coolant inlet 32 and a coolant outlet 34. The manifold 30 is constructed accordingly of two parts, namely, an inlet manifold 36 which brings coolant from the chiller 28 to the inlets 32 of the heat exchangers 26, and an outlet manifold 38 which returns the coolant from the outlets 34 of the heat exchangers 26 to the chiller 28. In an alternative embodiment of the invention, the inlet and the outlet ports in each heat exchanger are formed coaxially, and the manifold is modified to mate with the coaxial ports, as will be described hereinafter.

With respect to the manifold 30, the inlet manifold 36 and the outlet manifold 38 are constructed in the same fashion. The manifolds 36 and 38 each embody the same features of the invention, and are constructed by use of a manufacturing process employing aspects of the invention. Accordingly, the ensuing description of the manifold 30 is directed to the inlet manifold 36, it being understood that the description applies equally well to the outlet manifold 38.

Figure 2:
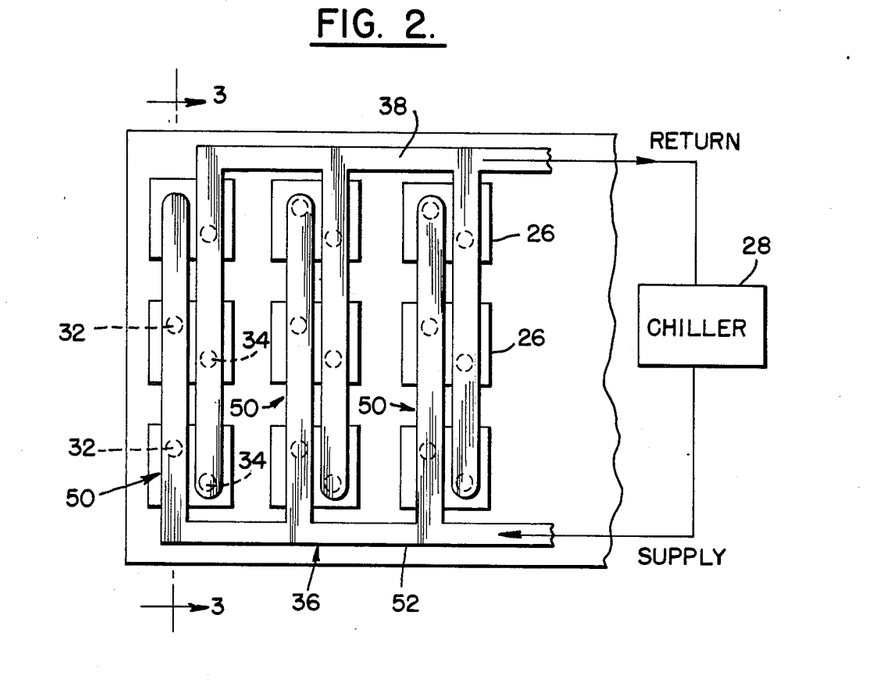
FIG. 2 is a plan view of one embodiment of the manifold of FIG. 1, shown partially in schematic form.
Figure 3:
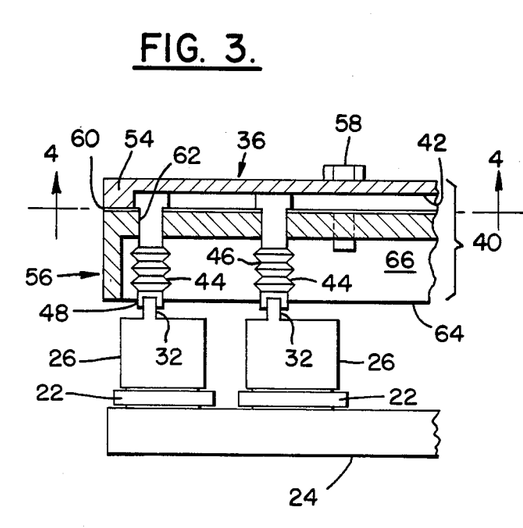
FIG. 3 is a sectional view of a branch of the manifold taken along the line 3—3 in FIG. 2.

In accordance with the invention, the inlet manifold 36 comprises a solid body 40 containing a coolant conduction channel 42, and a set of flexible hollow appendages 44 which extend from the body 40 and serve as conduits for conducting liquid coolant from the channel 42 to the inlets 32 of respective ones of the heat exchangers 26. Each appendage 44 has the shape of a bellows with accordion folds 46 which allow for extension and retraction of a mouth 48 of the appendage 44, as well as for a sidewise displacement of the mouth 48, to facilitate alignment and connection of the mouth 48 with an inlet 32. The inlet manifold 36 is formed in the configuration of a set of branches 50 extending from a stem 52, this configuration providing for a distribution of the coolant among the rows of the heat exchangers 26 to which the respective branches 50 are connected by their appendages 44.

Figure 4:
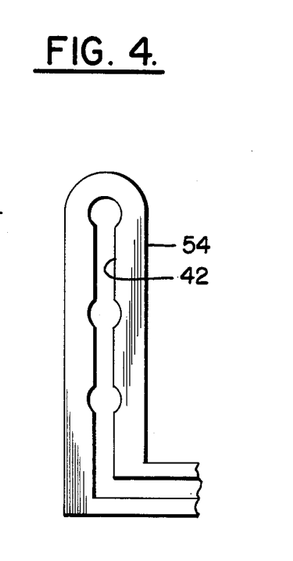
FIG. 4 shows liquid conduits formed as channels in the underside of a top plate of the manifold, the view being taken along the line 4—4 in FIG. 3.

The body 40 is constructed of a top section 54 and a bottom section 56 which are held together by bolts 58 with a gasket 60 disposed between the sections 54 and 56 to insure a water-tight fit. The coolant conduction channel 42 is machined into the top section 54, prior to connection of the top section 54 to the bottom section 56. The bottom section 56 includes a set of apertures 62 to which are secured the appendages 44. Upon connection of the top section 54 to the bottom section 56, the apertures 62 align with the channel 42 so as to form a continuous coolant path from the stem 52 to the mouths 48 of the appendages 44. The bottom section 56 is formed with sidewalls 64 which define a central chamber 66 for holding wax to be used in the construction of the appendages 44 in accordance with a manufacturing process of the invention, to be described hereinafter. The sidewalls 64 also serve to provide rigidity to the inlet manifold 36, as well as to position the inlet manifold 36 above the array of heat exchangers 26.

Figure 5:
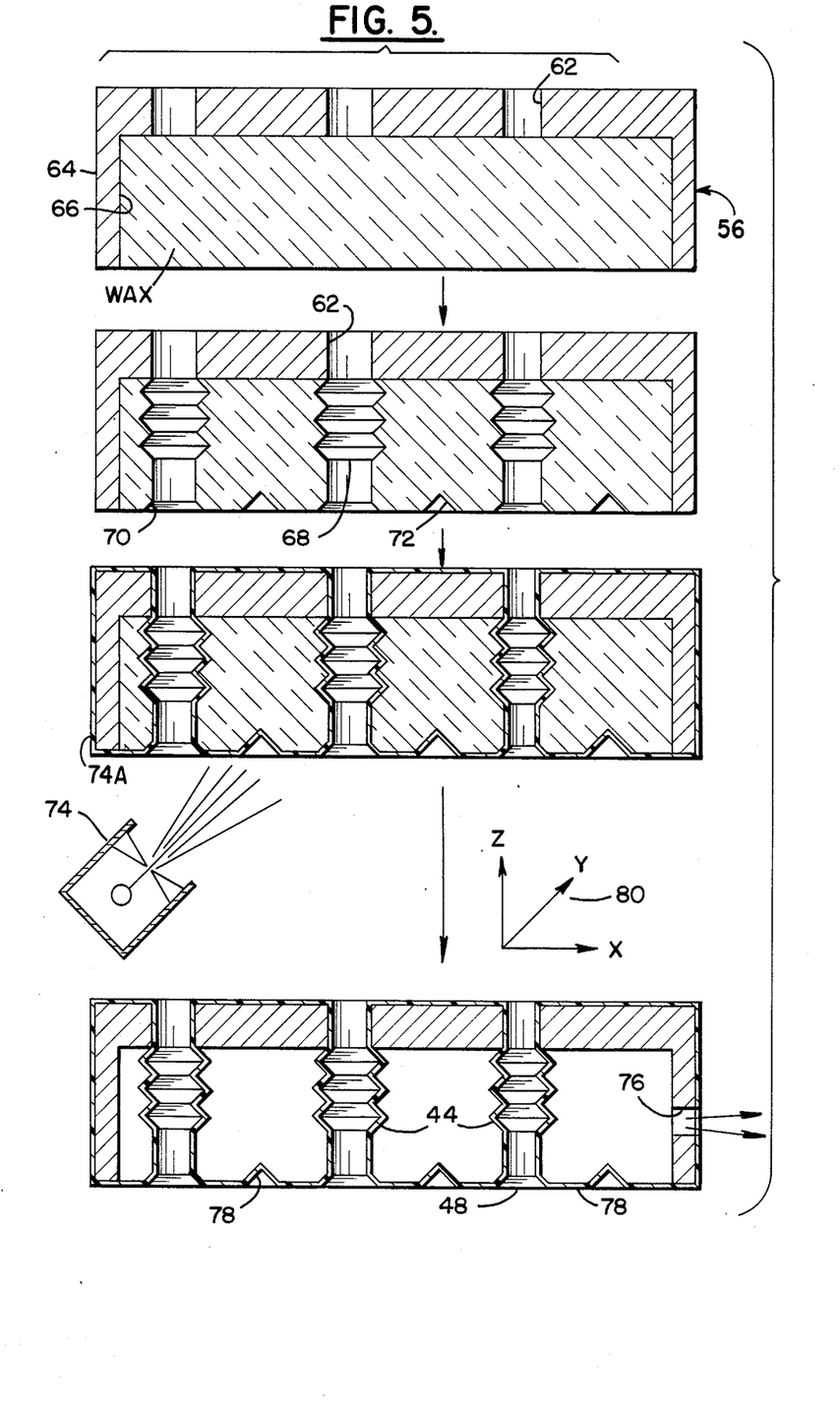
FIG. 5 shows a sequence of steps in the manufacture of the manifold of FIG. 2.

FIG. 5 shows manufacturing steps, in accordance with the invention, for fabricating the bottom section 56 of the manifold body 40 in a water-tight union with a set of appendages 40 joining the body 40 at the apertures 62. The bottom section 56 includes the apertures 62 and the sidewalls 64. The bottom section 56 is formed first from an easily machinable block of metal such as aluminum or other light-weight material which is easily machinable or moldable including an injection moldable plastic. The aluminum may be sandblasted to improve adhesion of the plastic material of the appendage to be secured thereto. A readily machinable wax, paraffin, is poured into the chamber 66, and is solidified by cooling.

The manufacturing procedure continues with a milling of the wax. First, straight bores are milled in registration with the apertures 62. Then, accordion folds are milled into the sides of the bores to provide a bellows surface 68 communicating with each of the apertures 62. The bottoms of the bores are chamfered at 70 to provide skirt shapes to the mouths 48. Also, a fluting is provided to the surface of the wax at 72 to enable the subsequent formation of a pleated membrane which interconnects the mouths 48 of the appendages 44.

The next step is the deposition of a plastic material, by a process of chemical vapor deposition, on all exposed surfaces of the wax and exposed surfaces of the bottom section 56, including the apertures 62. This is accomplished in a vacuum chamber by use of a source 74 which ejects particles of plastic material in the form of a vapor which permeates all parts of the mold comprising the wax and the bottom section 56. The particles nucleate upon contact with the wax and the metal of the bottom section 56 to form an impervious skin of plastic material. The CVD process insures that the plastic particles impinge upon all portions of the foregoing surfaces, including blind portions thereof, thereby providing a conformal water-tight coating. It is noted that the presence of the plastic material on the upper surface of the bottom section 56 mates with the bottom surface of the top section 54, thereby closing off the open side of the channels 42 upon a joining of the top section 54 to the bottom section 56.

Accordingly, it is to be understood that the bottom section 56 does not come in contact with liquid coolant, but serves only to support the assembly of plastic appendages, which might include as many as one hundred appendages 44. Indeed, water-tight integrity can be obtained even without a water-tight joint between the material of the bottom section 56 and the plastic material of the appendages 44. The plastic bellows construction of the appendages 44 is sufficiently flexible to provide a further advantage, namely, mechanical isolation of stress from the heat-exchangers, chips 22 and substrate 24, which stress may be communicated from the chiller 28 to the manifold 30.

A suitable plastic material having the desired characteristics of flexibility and being chemically inert to common coolants, while allowing deposition by the CVD process, is produced commercially by UNION CARBIDE under the name of Parylene, this being a dimer of Di-Para-Xylylene converted by vaporization to a monomer comprising para-xylylene. This monomer is pyrolized at 680 degrees Celsius into a polymer poly-para-xylylene. The nucleation is enhanced by chilling the body section 56 and the wax therein by means of a conventional cold finger and chiller (not shown) to a temperature, for example, five degrees Celsius in the case of the Parylene. The plastic material can be deposited to a thickness ranging from a fraction of mil up to several mils. Thicknesses of 0.064 and 0.2 millimeters have been employed, the latter providing a stiffer appendage 44.

The process continues with the removal of the wax. This is accomplished by drilling a hole 76 in a sidewall 64, heating the wax, and pouring out the wax via the hole 76. If desired, a thorough removal of the wax can be accomplished by cleaning the interior surfaces of the body section 56 with a solvent such as 1-1-1,trichloroethane. After removal of the wax, there remains the plastic appendages 44 produced by the deposition of the plastic along the bellows surface 68 of the wax, and an articulated membrane 78 which joins the mouths 48 of the appendages 44 and is formed by the deposition of the plastic upon the fluted surface 72 of the wax. Alternatively, the fluted surface 72 of the wax with the plastic coating thereon can be removed by machining, prior to removal of the wax. This leaves the mouth ends of the appendages 44 free to swing about. In either case, with or without the membrane 78, there is sufficient flexibility in the plastic material to allow the mouths 48 of the appendages 44 to be displaceable in the x, y and z directions of a coordinate axes system 80, thereby to be readily connectable to the inlet ports 32 (or outlet ports 34) of a set of heat exchangers 26.

With reference to FIGS. 6-9, there is shown an alternative construction of a coolant delivery manifold 82 of the invention wherein the heat exchangers are formed with coaxially arranged inlet and outlet ports, and a coaxial assembly 84 of hollow appendages connects the heat-exchanger ports to the manifold 82. The manifold 82 comprises three sections, a first section formed as a rectangular or square cover plate 86 having a system 88 of fluid conduction channels therein, a second section formed as an inlet body section 90 having fluid conduction apertures 92 and sidewalls 94, and a third section at the bottom of the manifold 82 formed as an outlet body section 96 having enlarged fluid conduction apertures 98 and sidewalls 100. The inlet body section 90 and the outlet body section 96 have the same form, except for a difference in aperture size and overall dimensions, the outlet body section 96 being shown in detail in FIGS. 7-8. By way of example, the outlet body section 96 is shown as comprising a square array of thirty six apertures 98, it being understood that other rectangular arrays can be employed. The channel system 88 of the cover plate 86 is shown in detail in FIG. 9.

Figure 6:
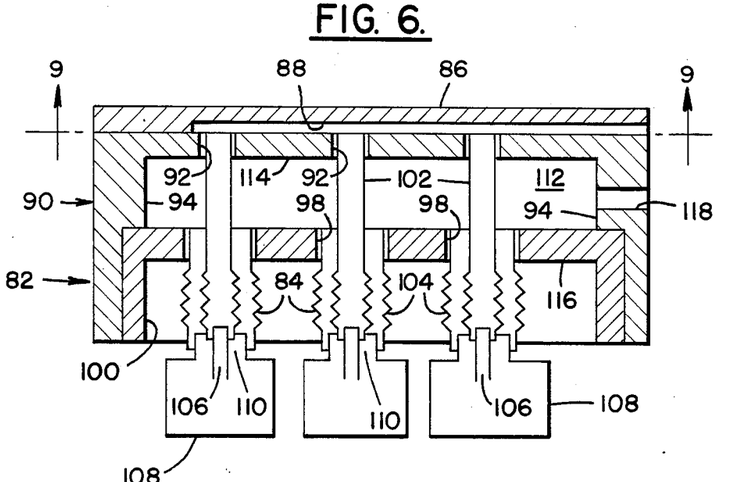
FIG. 6 is a sectional view of an alternative embodiment of the manifold constructed with coaxial hollow flexible appendages.
Figure 7:
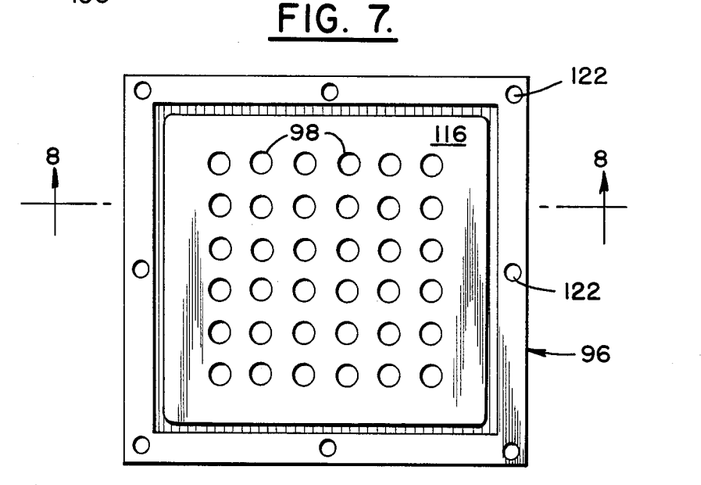
FIG. 7 is a plan view of the bottom body section in the assembly of FIG. 6.
Figure 8:
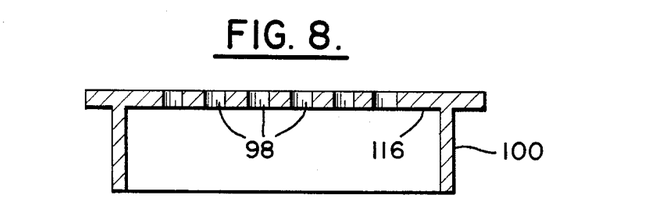
FIG. 8 is a sectional view of the bottom body section taken along the line 8—8 in FIG. 7.
Figure 9:
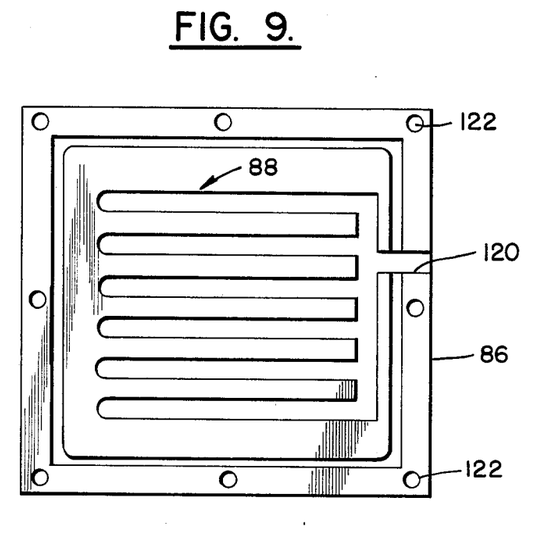
FIG. 9 shows channels in the underside of a top plate in the assembly of FIG. 6 for the conduction of liquid coolant, taken along the line 9—9 in FIG. 6.

Each appendage assembly 84 comprises a relatively long and narrow inlet appendage 102 secured to an aperture 92, and a relatively short and wide outlet appendage 104 secured to an aperture 98. The appendage 102 passes through the appendage 104 to connect with an inlet port 106 of a heat exchanger 108, while the appendage 104 connects with an outlet port 110 of the heat exchanger 108. The two ports 106 and 110 are coaxial, with the inlet port 106 being disposed within the outlet port 110. The upper ends of the outlet appendages 104 open, via the apertures 98, into a chamber 112 formed by the sidewalls 94 and floor portions 114 and 116, respectively, of the inlet body section 90 and the outlet body section 96. The chamber 112 opens via a port 118 in a sidewall 94 to a return conduit to the chiller 28 (FIG. 2). The upper ends of the inlet appendages 102 open, via the apertures 92, into the channels of the system 88. The channel system communicates via a port 120 to a supply line of the chiller 28 (FIG. 2) for reception of coolant from the chiller 28. The cover plate 86 and the body sections 90 and 96 are connected together by water-tight seals (not shown) and held in position by bolts (not shown) threaded through holes 122 in the body sections 90 and 96.

In the fabrication of the manifold 82, the inlet body section 90 with its relatively long inlet appendages 102, and the outlet body section 96 with its outlet appendages 104 are constructed each in accordance with the process disclosed in FIG. 5. In this respect, it is noted that the sidewalls 94 of the inlet body section 90 are taller than the sidewalls 100 of the outlet body section 96, the increased height of the sidewalls 94 providing a wax-holding chamber large enough to accommodate the extra length of the inlet appendages 102. Upon completion of the assembly of both body sections 90 and 96 with their respective appendages 102 and 104, construction of the manifold 92 continues with insertion of the inlet appendages 102 into the outlet appendages 104, followed by a securing of the cover plate 86 and the outlet body section 96 to the inlet body section 90. The appendages 102 and 104 may be secured to the ports 106 and 110 of a heat exchanger 108 with epoxy glue, this providing sufficient strength because of the relatively low coolant pressure employed, typically less than a few pounds per square inch. This completes construction of the coaxial manifold.

Figure 10:
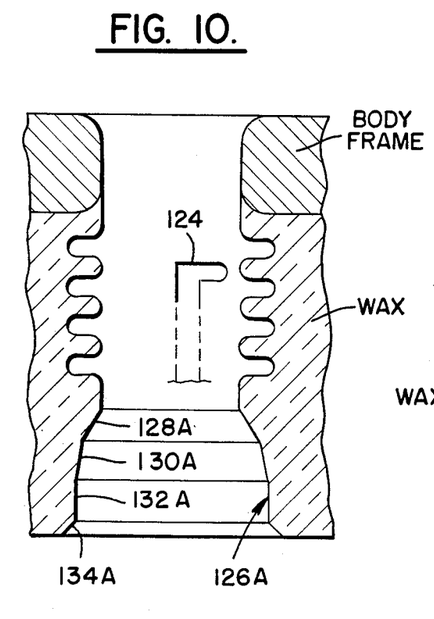
FIG. 10 is a fragmentary view of a paraffin mold for the construction of an appendage having one form of bellows.
Figure 11:
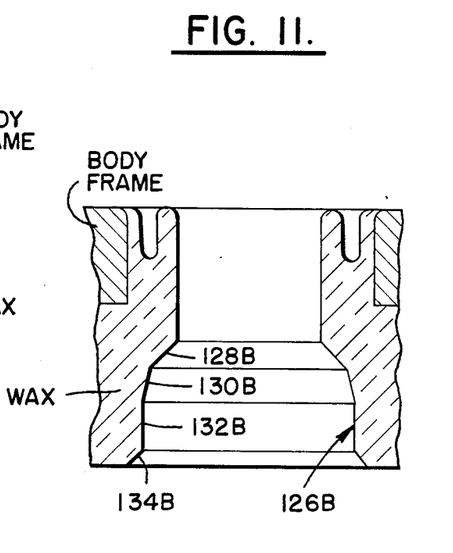
FIG. 11 is a fragmentary view of a paraffin mold for the construction of an appendage having a second form of bellows.

FIGS. 10 and 11 show alternative embodiments of wax molds suitable for construction of the flexible hollow appendages for conduction of coolant to a heat exchanger. In FIG. 10, the accordion folds are cut with a cutter 124, shown by way of example in the Figure, directly into the sides of the mold in a direction perpendicular to a central axis of the mold. The cutter 124 is driven by a numerically controlled milling machine (not shown). In FIG. 11, an accordion fold is cut as a reentrant circular trough in a direction parallel to a central axis of the mold. Both types of folds provide the requisite flexibility to the appendages. Also shown in FIG. 10 is a skirt region 126A composed of circular zones 128A, 130A, 132A and 134A wherein the surfaces are inclined respectively at angles of 45, 5, 0 and 45 degrees. This facilitates emplacement of the mouth of an appendage on a port of a heat exchanger. Similarly, in FIG. 11, the wax mold is provided with a skirt region 126B composed of circular zones 128B, 130B, 132B and 134B wherein the surfaces are inclined respectively at angles of 45, 5, 0 and 45 degrees.

The foregoing manifold construction of the invention is particularly advantageous because the flexibility of the coolant conduit appendages allows for positioning of the heat exchangers on their respective circuit chips independently of various differences in orientation which may be present. Thus, there is no requirement that all heat exchangers must be aligned with each other. Each heat exchanger may be placed in intimate thermal contact with the corresponding circuit chip. Any differences in orientation of the heat exchangers is readily accommodated by the flexibility of the appendages. In addition, the fabrication of the accordion folds by means of the lost wax process and by chemical vapor deposition of the plastic material allows for conformal adhesion of the plastic material to the solid body portion of the manifold for water-tight fit.

It is to be understood that the above described embodiments of the invention are illustrative only, and that modifications thereof may occur to those skilled in the art. Accordingly, this invention is not to be regarded as limited to the embodiments disclosed herein, but is to be limited only as defined by the appended claims.

Having thus described our invention, what we claim as new, and desire to secure by Letters Patent is:

1. A manifold for conducting coolant to a plurality of electric circuit chips having cooling devices connected thereto, the manifold comprising:
   a body having a first and a second coolant conduit means, said body including a first set of apertures communicating with said first conduit means and a second set of apertures communicating with said second conduit means;
   a first set and a second set of flexible hollow appendages connected to said body respectively at said first and said second sets of apertures and extending from said body for conduction of coolant between said cooling devices and said first and said second conduit means of said body, each of said appendages being distensible to allow connection with ports of said cooling devices; and wherein
   said first conduit means and said second conduit means are separate from each other for maintaining separate flows of the coolant to and from each of said cooling device; said body further comprising
   a plurality of sections extending transversely of said appendages and being arranged alongside one another to define said first and said second conduit means including fluid conduction passages therein, said first and said second sets of apertures being disposed in separate ones of said sections spaced apart from each other to permit connection of said first and said second sets of appendages independently of each other to their respective first and second sets of aperture ;and wherein
   a first one of said body sections and a second one of said body sections are secured together, said first conduit means being formed within said first section, and said first set of apertures being formed in said second section;
   two of said appendages are connectable with each of said cooling devices, one of said two appendages serving as an inlet coolant conduit and the second of said two appendages serving as an outlet coolant conduit;
   said two appendages are mounted coaxially of each other with one appendage being outside of and surrounding the other inner appendage, and wherein a third one of said body sections is secured to said second section and has said second set of apertures in registration with the apertures of said second section, the inner appendage of said two appendages connecting with an aperture of said second section and the outer appendage of said two appendages connecting with an aperture of said third section; and wherein
   said second section has sidewalls contacting said third section for spacing said first set of apertures away from said cooling devices at a distance greater than a spacing of said second set of apertures from said cooling devices, the inner one of said two appendages being longer than the outer one of said two appendages to extend said greater distance from said cooling devices to said first set of apertures, the differing lengths of inner and outer appendages facilitating connection of inner and outer appendages independently of each other to a cooling device.

2. A manifold according to claim 1 wherein each of said appendages mates with a corresponding aperture by a conformal fitting to the body, thereby to insure a coolant-tight fit.

3. A manifold according to claim 2 wherein said appendages are formed with a bellows-like structure to provide flexibility.

4. A manifold according to claim 3 wherein said body is divided into an inlet portion connecting with each inlet appendage, and an outlet portion connecting with each outlet appendage.

5. A manifold according to claim 3 wherein said body has a rectangular shape, and wherein said second section has additional apertures for connecting with additional appendages, the apertures of said second section being arranged in an array of rows and columns.

6. A manifold according to claim 1 wherein said appendages are sufficiently flexible to provide stress relief between a source of said coolant and said cooling devices.

7. A manifold according to claim 3 wherein said three body sections are arranged such that said third section is located between said first section and said cooling devices, and said second section is located between said first section and said third section, there being a surface of said first section facing a surface of said second section and a surface of said second section facing a surface of said third section, the facing surfaces of said first and said second sections being configured to define fluid conduction passageways of said first conduit means, the facing surfaces of said second and said third sections being withdrawn away from each other to define a fluid conduction passage of said second conduit means, and wherein an inner appendage extends beyond an encircling outer appendage to extend through said second conduit means to connect with an aperture of said second section.

8. A manifold according to claim 7 wherein said second and said third sections are sufficiently thick to provide a depth to the apertures disposed therein, which depth allows for said conformal fitting of appendages to their corresponding appertures, and wherein said body is a solid.

* * * * *